United States Patent [19]

Zitzmann

[11] Patent Number: 4,966,642
[45] Date of Patent: Oct. 30, 1990

[54] METHOD OF THE CONTINUOUS PRODUCTION OF CIRCUIT BOARD STRUCTURES

[75] Inventor: Klaus Zitzmann, Krefeld, Fed. Rep. of Germany

[73] Assignee: G. Siempelkamp GmbH & Co., Krefeld, Fed. Rep. of Germany

[21] Appl. No.: 333,989

[22] Filed: Apr. 5, 1989

[30] Foreign Application Priority Data

Apr. 6, 1988 [DE] Fed. Rep. of Germany ....... 3811467

[51] Int. Cl.[5] ............................................. B32B 31/08
[52] U.S. Cl. ..................................... 156/164; 156/182; 156/307.4; 156/307.7; 156/324
[58] Field of Search ............... 156/182, 324, 629, 630, 156/307.3, 307.4, 307.7, 163, 164; 428/268, 285, 263, 416, 418

[56] References Cited

U.S. PATENT DOCUMENTS

| | | | |
|---|---|---|---|
| 4,407,883 | 10/1983 | Newton | 156/307.3 X |
| 4,543,145 | 9/1985 | Schnell et al. | 156/307.7 X |
| 4,579,612 | 4/1986 | Held | 156/324 X |
| 4,659,425 | 4/1987 | Eggers et al. | 156/324 X |
| 4,670,080 | 8/1987 | Schwarz et al. | 156/307.5 |
| 4,690,721 | 9/1987 | Schermutzki | 156/307.7 X |

OTHER PUBLICATIONS

Herbert Bruch et al., Handbuch der Leiterplattentechnik, Eugen G. Leuze Verlag, D-7968 Saulgau/Wurtt., Zweite Auflage, ISBN 3-87480-005-9.

Primary Examiner—Michael W. Ball
Assistant Examiner—Mark A. Osele
Attorney, Agent, or Firm—Herbert Dubno

[57] ABSTRACT

To avoid distortion of metal strips flanking the glass fiber resin layers in a system for fabricating circuit board structures in a continuous press, the metal foil webs are bonded to glass fiber webs before the layers are introduced into the mouth of the continuous press and only in the mouth do composite layers meet additional glass fiber and resin layers.

12 Claims, 3 Drawing Sheets

METHOD OF THE CONTINUOUS PRODUCTION OF CIRCUIT BOARD STRUCTURES

FIELD OF THE INVENTION

My present invention relates to a method of and to an apparatus for the production of a circuit board structure, i.e. a substrate which can be formed into printed circuit boards and the like and which generally comprises a core or base of a hardened synthetic resin reinforced by glass fibers and constituting a nonconductive or insulating support and a metal layer on one or both surfaces of this support and bonded to the electrically insulating material.

The continuously produced board can be cut into lengths to form individual boards of desired dimensions and can be etched or otherwise treated to transform the conductive layers into conductor tracks for making a variety of electrical connections, e.g. in the production of so-called printed circuit boards.

BACKGROUND OF THE INVENTION

It is known to use a continuous press for the lamination of a metal foil constituting one of the outer layers or the outer layer of the structure and at least one layer of glass fiber containing a thermally hardenable synthetic resin by continuously passing the layers through the press and subjecting the layers in the press to an appropriate pressure heating to activate the thermally hardenable binder and, if desired, cooling.

Two metal foil webs can flank a multiplicity of layers of the glass fiber impregnated with the thermally hardenable synthetic resin where the resulting laminated structure is to have conductive metal surfaces flanking an electrically insulating core.

As indicated, it is known to continuously produce the hard structure for use in the fabrication of circuit boards in a continuously operating press which can have, at the mouth thereof, a pair of drums over which respective press belts are guided, the press belts defining the mouth and entraining the layers through the mouth into a pressing gap between pressing plates or tables, for example, provided with heating means and, if desired, with cooling means downstream from the heating means. The cooling can, of course, be effected downstream of the continuous throughput press.

Within the press and in the pressing region, i.e. the gap, the layers are subjected to compaction and heating to activate the thermosetting binder, thereby producing a rigid composite strip which emerges from the press for possible cooling and further circuit board fabrication techniques.

A system of this type is described in the Siempelkamp Bulletin of May 1983, pages 4 and 9 and Section 3.2.

Also, as background to the present invention, attention may be directed to German Patents Documents No. 31 19 529 and 34 32 548 which describes continuous presses for the production of laminated products in a continuous manner as described above.

When reference is made herein to glass strips, it will be understood that I intend to so identify woven and nonwoven glass fiber webs, generally impregnated with thermally activatable synthetic resins. The thermally hardenable or thermosetting resins can be epoxy resins, phenolics and any of the other thermally hardenable resins which have been used in the fabrication of printed circuit boards heretofore.

The metal foils which are used are usually copper foil webs.

With respect to the resins which are employed, reference can be made to the Handbuch der Leitertplattentechnik, 1982, pages 25–52 in which the starting webs or layers are so-called prepregs and in which glass fiber webs are impregnated with epoxy resins in the so-called B-state. It is not necessary, using such prepregs to subject the glass fiber webs or metal foil webs to any special thermal treatment as long as the compression and temperature conditions in the press are capable of forming the rigid and consolidated product.

It has been found, however, that problems have been encountered in the past in the processing of extremely thin metal foils through such presses and in the prior art processes.

In particular, mention can be made of the fact that when the laminated structure is to be produced at a high rate and though the metal foil may be used at a high velocity to the press, frequently the foil will wrinkle, double-up, fold, tear or distort. While these drawbacks can be avoided by the use of thick foils, frequently thick foils are not desirable.

The same drawback applies to the system of U.S. Pat. No. 4,670,080 in which prepregs which do not require prior thermal treatment upon entry into the press are not used, but rather the press may be equipped to carry out a pressureless preheating of the glass fiber strip to the point that the epoxy resin system will no longer be in the B-state at the time of consolidation.

OBJECTS OF THE INVENTION

The principal object of the present invention is to provide an improved method of making laminated structures of the type described which allows the use of very thin and delicate metal foils, has a high rate of production and is, therefore, more economical while avoiding the drawbacks of the earlier systems and particularly the distortion and damage to the metal foil layer which has hitherto been encountered when especially thin layers have been used heretofore.

Another object of my invention is to provide an improved apparatus for carrying out the process of the invention.

SUMMARY OF THE INVENTION

These objects and others which will become apparent hereinafter are attained, in accordance with the present invention, in a method wherein the metal foil strip or the metal foil strips are each bonded at a continuous interface to a respective glass fiber strip as such strips have been defined above, prior to feeding the resulting two-layer composite or composites into the mouth of the continuously operating press together with others of such glass fiber strips to form in the mouth of the press the stack which is then advanced between the press belts into the pressing gap.

The two-layer composite strip formed outside the pressing gap and before the or each two-layer composite strip meets the other glass strips of the stack, permits exceptionally thin foils to be processed through the press without any of the drawbacks enumerated above.

Of course, the two-layer composite strips can be fabricated at a location other than that of the press and prior to use so that the two-layer composite strip can be stored and then delivered to the press as required.

However, it is preferred, in accordance with the invention, to provide the press with means which form the two-layer composite strip directly upstream of the mouth of the press, e.g. against surfaces of the press belt extending around the drums defining the mouth.

The intimate uniting of the layers of the two-layer composite can be effected with a minimum of pressing force applied to these layers and without subjecting them to a significant temperature increase.

More particularly, the method of the invention for making a circuit board structure can comprise the steps of:

(a) uniting a strip of a metal foil and a glass-fiber strip containing a thermally hardenable synthetic resin at a contact interface therebetween to form a two-layer composite strip;

(b) continuously feeding said composite strip and additional continuous glass-fiber strips containing thermally hardenable synthetic resin together into a mouth of a continuous press between a pair of juxtaposed drums around which pressing belts are guided to form said mouth and between said pressing belts so as to form continuously a stack of said strips with said metal foil forming an outer surface of said stack, whereby said two-layer composite strip meets layers formed by said additional strips in said press;

(c) passing said stack between said pressing belts through said press while heating said stack so as to merge said glass-fiber strips, compact said stack and harden said resin and form a continuous board; and (d) cooling said board.

The apparatus which has been found to be particularly effective for this purpose is a continuous press which comprises:

a press frame;

an upper press table and a lower press table vertically spaced apart on said frame and extending substantially parallel to one another at least over a pressing region of the press;

an endless upper steel press belt passing under said upper press table and an endless lower steel press belt passing over said lower press table and defining a pressing gap between them through which said composite structure is guided, said press tables having means for thermally treating said composite structure by heat conduction through said press belts;

guide means for guiding said endless belts over respective endless paths and including respective drums around which said belts pass at a mouth opening into said gap and through which said layers are guided between said belts;

a respective layer of roller bars disposed between each of said tables and the respective press belt and rolling between them in the region of said gap, each of said layers of roller bars being comprised of roller bars with a diameter of substantially 13 to 20 mm and having a statistical average spacing of at most 2 mm as said roller bars roll in said region; and means on said frame for circulating said roller bars of the layers of roller bars along endless paths.

The invention is based upon my discovery that distortion of the metal foil may in part be a function of the relative movement of the metal foil and an adjoining glass fiber strip in prior art systems in which especially thin metal foils are fed directly to the mouth of the press while the glass fiber strips are fed separately therefrom to the mouth. Surprisingly, these problems no longer arise when, prior to entry into the mouth of the press, the or each metal foil has been previously surface bonded to a glass fiber strip to form the aforementioned two-layer composites so that the metal foil only enters the mouth of the press as part of a two-layer composite.

When I refer to surface bonding or a uniting of the two layers of the two-layer composite at an interface, I mean to describe an adhesive connection or attachment between the two which is uniform and effective over the entire interface.

It is sufficient that the metal foil web and the glass fiber web joined thereto be adhesively bonded at a multiplicity of discrete points as long as these points lie very close together. Of course, a complete continuous surface bond may be effected as well, provided that the synthetic resin component of the composition is not completely hardened As a consequence, the bond between each two-layer composite and the further glass fiber strips or webs in the continuous press is ensured.

According to a feature of the invention, the adhesive bond between the metal foil web and the glass fiber web of the two-layer composite is effected utilizing the thermally hardenable synthetic resin of this glass fiber web under the application of pressure and heat, but under such conditions, detrimental changes in the synthetic resin system do not occur. An adhesive bond can, however, be effected by a foreign binder or adhesive i.e. one which is not originally part of the glass fiber web and can be coated, for this purpose, onto either or both of the layers joined to form the two layer composition.

In a preferred embodiment of the invention which has been particularly suitable in practice, because it produces an extremely smooth two-layer composite strip, the metal foil web and the glass fiber web are brought together under tension and united at their contact surface. This can be effected in various ways. In a particularly simple and reliable manner, one embodiment of the invention provides that the metal foil web and the glass fiber web are guided over a segment of the periphery of a rotating drum which is synchronous with the press and is bonded to the glass fiber web, e.g. by heating of the drum surface or the drum.

Where the drum against which the composite web is formed is also a drum around which is a press belt, especially a metal press belt such as a steel press belt, the glass fiber web is drawn against the metal web under tension and under conditions which will effect the adhesive bonding of the two layers of the composite strip.

Especially effective results in the fabrication of circuit board structures are obtained when the remaining glass fiber strips can pass into the mouth of the press in a thermally unaffected manner. Surprisingly, the metal web of the present invention and the composite strip formed thereby can be so located as to act as a shield against detrimental radiant heating of the other glass fiber strips which are thus supplied to the press belts.

The glass fiber strips which are thus supplied to the press in addition to the composite strips, can be fed in their original states, without thermal transformation and thus without any of the defects associated with thermal degradation or change of state of the resin contained in glass fiber strips utilized in earlier systems.

As noted, a part of the invention is also an apparatus for carrying out the described method.

It is important that the apparatus be constructed so that the heating of the stack of strips fed to the press be well-defined and uniform.

I have found, quite surprisingly, that when a roller bar arrangement is provided between each steel press belt and the respective press table and the roller bar layer is circulated in a closed path, the desired uniformity of heating and indeed, uniformity of the resulting product, can be obtained when the roller bars as they roll in the region of the press gap have a statistically average spacing of no more than 2 mm while being of 13 to 20 mm and preferably 18 mm in diameter.

According to a feature of this invention, this apparatus is provided with means for varying the arc length of contact of the composite against the drum and press belt and/or to vary the tension with which the composite is formed.

The press belt can be provided at the requisite temperature or the thermal conditions controlled by the contact angle of the composite with the drum and belt as may be required in the formation of the composite without thermal destruction of the glass fiber web thereof.

In accordance with the invention, the glass fiber web which is juxtaposed with the metal foil web are joined together to form the composite. The glass fiber web itself may be composed of a plurality of layers.

Additional glass fiber webs can be fed to the two-layer composite and can be united with the latter under the application of heat and pressure even before the layers enter the mouth.

All of the glass fiber webs can be provided in two-layer aggregates as they enter the mouth.

The invention has the principal advantage that the distortion or destruction of thin metal foil webs is precluded.

Possibly, this is a consequence of the fact that at the side of the metal web, as the layers enter the mouth, the metal web is bent in a concave pattern and returns to the planar configuration only within the press. This appears to generate tensile forces in the metal web which preclude distortion in a reliable manner.

BRIEF DESCRIPTION OF THE DRAWING

The above objects, features and advantages of my invention will become more readily apparent from the following description, reference being made to the accompanying drawing in which.

SPECIFIC DESCRIPTION

Figure 1:
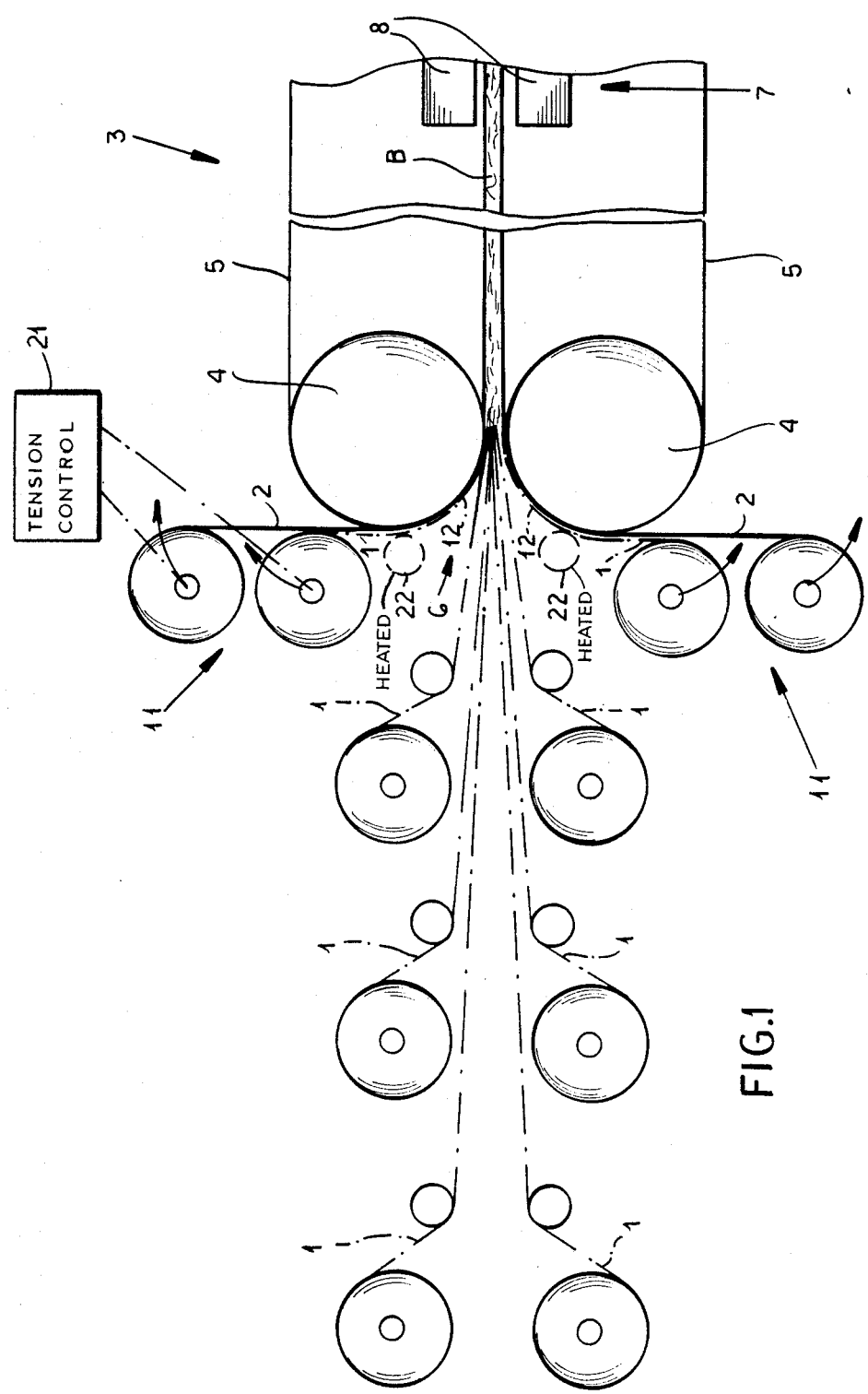
FIG. 1 is a diagrammatic side view illustrating principles of the invention.

As can be seen from FIG. 1, a plurality of glass fiber webs 1 is impregnated with thermally hardenable synthetic resin, as described, and two metal foil webs 2 are assembled to form a stack B which has its upper and lower surfaces formed by the metal foil webs 2.

The stack B is passed through a continuous press 3 which has been shown only diagrammatically in FIG. 1.

The press comprises a pair of deflecting drums 4 over which steel press belts 5 are guided so that at the inlet side of the press, the drums 4 define an inlet mouth 6.

Figure 3:
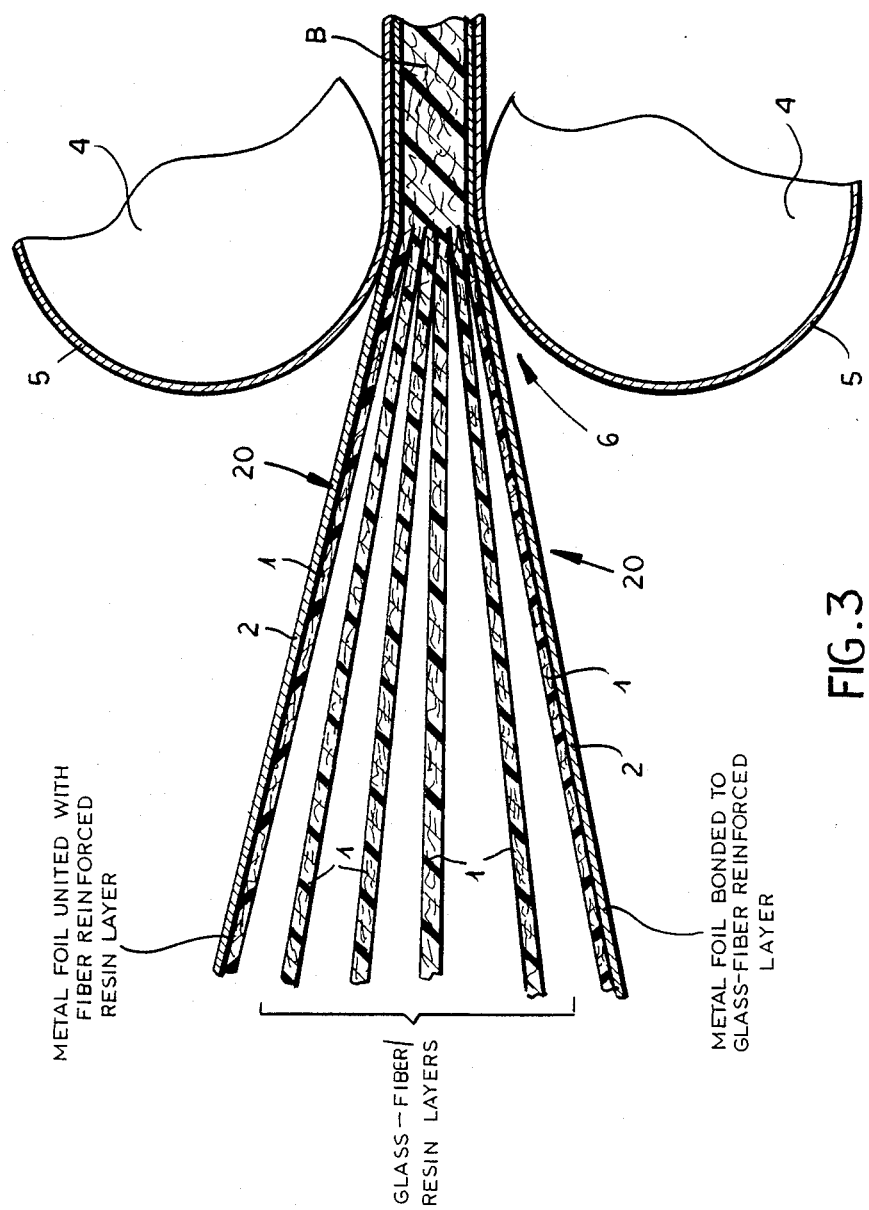
FIG. 3 is a diagrammatic section also illustrating principles of this invention.

However, before entering the mouth 6, each of the metal foils 2 is bonded to a respective glass fiber web 1 so that an intimate adhesive bond is formed between them such that the two layers are firmly united in a two layer composite strip which has been identified separately at 20 in FIG. 3.

In the embodiment of FIG. 3, the two-layer composites 20 have previously been formed and are fed to the mouth of the press without contacting the drum 4 or the steel press belt 5 passing therearound.

However, in the embodiment of FIG. 1, each of the two-layer composite strips 12 is formed by guiding the metal strips 2 under tension against the press belts 5 as they pass around and synchronously move with the drum 4. The respective glass fiber webs 1 are thus pressed under tension against the metal webs and, under the heat from the heated drums 4, transmitted through the press belts 5 and the metal webs 2, there is a thermal bonding of each metal web 2 to the respective glass fiber web.

The stack B thus passes through a gap in the press region 7 in which the stack is subjected to heat and pressure to bond the layers together and cause thermosetting of the synthetic resin material, thereby producing the circuit board structure in a continuous strip outputted from the press.

Figure 2:
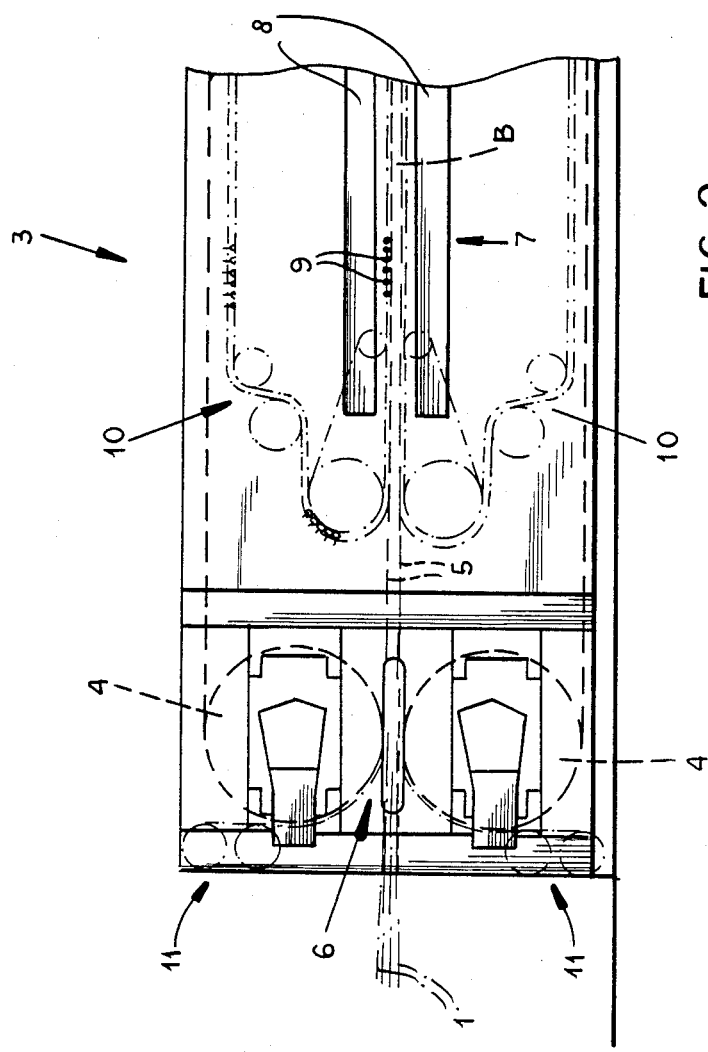
FIG. 2 is a side elevational view of the portion of a continuous press for carrying out the invention.

In FIG. 2, I have shown other details of the press and thus it will be apparent that in the press region 7, the upper and lower press tables 8 can be formed as heating plates or both heating and cooling plates 8.

In the press region 7 between the press tables 8 and the respective steel belts 5, roller bar layers consisting of spaced apart roller bars 9 are disposed.

The roller bars 9 are conveyed in the direction of movement of the press belts by a displacement arrangement 10 transporting each layer of roller bars in a closed path.

In the case of the fabrication of circuit board structures, I have found that the roller bars should have diameters of 13 to 20 mm, preferably about 18 mm and a spacing which as the bars roll through the region between the tables 8 and the belts 5, the mean distance between the bars will be no more than 2 mm. This cannot be shown in FIG. 2 because of the small scale of the illustration. Means 21 can be provided for controlling the tension on the layers 1 and 2 to form each composite strip and this means can vary the degree to which the layers are in arcuate contact with which press belt 5 on the respective drum and, of course, the tension.

If desired, a pressing roller 22 can also be provided to compress the composite layer.

I have found that the press as described and operated in the manner set forth gives rise to especially flat, uniform and homogeneous circuit board structures with extremely smooth metal layers and without any of the drawbacks discussed above.

I claim:

1. A method of making a circuit board structure, comprising the steps of:
    (a) uniting a strip of a metal foil and a glass-fiber strip containing a thermally hardenable synthetic resin at a contact interface therebetween to form a two-layer composite strip;
    (b) continuously feeding said composite strip and additional continuous glass-fiber strips containing thermally hardenable synthetic resin together into a mouth of a continuous press between a pair of juxtaposed drums around which pressing belts are guided to form said mouth and between said pressing belts so as to form continuously a stack of said strips with said metal foil forming an outer surface of said stack, whereby said two-layer composite strip meets layers formed by said additional strips in said press, said uniting of step (a) comprises said metal foil and said glass-fiber strip being held under tension and applied to an arcuate portion formed by one of said belts as it rotates around a respective one of said drums and against which surface the layers of said two-layer composite strip are united;

(c) passing said stack between said pressing belts through said press while heating said stack so as to merge said glass-fiber strips, compact said stack and harden said resin and form a continuous board, said metal foil and said glass-fiber strip united therewith shielding said additional glass-fiber strips from heat radiation emanating from at least one of said belts and from a respective one of said drums whereby said additional glass-fiber strips pass into said mouth without being subjected to detrimental thermal radiation; and (d) cooling said board.

2. The method defined in claim 1 wherein said strip of a metal foil and said glass-fiber strip containing thermally hardenable synthetic resin are continuous and are continuously united at said contact interface therebetween to form said two-layer composite strip in step (a) continuously.

3. The method defined in claim 1 wherein said strip of a metal foil and said glass-fiber strip containing thermally hardenable synthetic resin are united at said contact interface therebetween by activation of said thermally hardenble synthetic resin under heat and pressure in step (a).

4. The method defined in claim 1 wherein said strip of a metal foil and said glass-fiber strip containing thermally hardenable synthetic resin are united at said contact interface therebetween by applying tension to the strips forming said two-layer composite strip and pressing them together under said tension.

5. The method defined in claim 4 wherein light tension is generated in said metal foil and the glass-fiber strip united therewith to form said two-layer composite strip by applying them to a portion of an arcuate surface rotating synchronously with said press belts and against which the layers of said two-layer composite strip are united.

6. The method defined in claim 1 wherein a respective two-layer composite strip formed from a respective metal foil and a respective glass-fiber strip containing a thermally hardenable resin and united therewith prior to entry into said mouth are fed to said mouth on opposite sides of said additional glass-fiber strips so that said stack has the metal foil on upper and lower surfaces thereof as said stack passes through said press.

7. The method defined in claim 6 wherein said metal foil and the glass-fiber strip united therewith of each two-layer composite strip shield said additional glass-fiber strips from heat radiation emanating from the respective press belts and from the respective drums whereby said additional glass-fiber strips pass into said mouth without being subjected to detrimental thermal radiation.

8. The method defined in claim 7 wherein said strip of a metal foil and said glass-fiber strip containing thermally hardenable synthetic resin of each of said two-layer composite strips are continuous and are continuously united at said contact interface therebetween to form said two-layer composite strips in step (a) continuously.

9. The method defined in claim 8 wherein said strip of a metal foil and said glass-fiber strip containing thermally hardenable synthetic resin of each two-layer composite strip are united at said contact interface therebetween by activation of said thermally hardenable synthetic resin under heat and pressure in step (a).

10. The method defined in claim 9 wherein said strip of a metal foil and said glass-fiber strip containing thermally hardenable synthetic resin of each of said two-layer composite strips are united at said contact interface therebetween by applying tension to the strips forming said two-layer composite strips and pressing them together under said tension.

11. The method defined in claim 10 wherein light tension is generated in said metal foil and the glass-fiber strip united therewith to form each of said two-layer composite strips by applying them to portions of arcuate surfaces rotating synchronously with said press belts and against which the layers of each two-layer composite strip are united.

12. The method defined in claim 11 wherein said surfaces are formed by said belts as said belts pass around respective ones of said drums whereby said layers of said two-layer composite strips are united against said belts.

* * * * *